United States Patent
Yoneda

(10) Patent No.: US 7,098,154 B2
(45) Date of Patent: Aug. 29, 2006

(54) METHOD FOR FABRICATING SEMICONDUCTOR DEVICE AND SEMICONDUCTOR DEVICE

(75) Inventor: Kenji Yoneda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 29 days.

(21) Appl. No.: 10/774,522

(22) Filed: Feb. 10, 2004

(65) Prior Publication Data

US 2004/0227196 A1    Nov. 18, 2004

(30) Foreign Application Priority Data

Apr. 8, 2003    (JP) ............... 2003-103744

(51) Int. Cl.
*H01L 21/469* (2006.01)
*H01L 21/31* (2006.01)

(52) U.S. Cl. .................. 438/786; 21/267

(58) Field of Classification Search .......... None
See application file for complete search history.

(56) References Cited

U.S. PATENT DOCUMENTS

| | | | |
|---|---|---|---|
| 5,940,690 A * | 8/1999 | Kusumoto et al. ......... | 438/149 |
| 6,033,998 A * | 3/2000 | Aronowitz et al. ........ | 438/786 |
| 6,265,327 B1 * | 7/2001 | Kobayashi et al. ........ | 438/776 |
| 6,503,846 B1 | 1/2003 | Niimi et al. | |
| 6,660,659 B1 * | 12/2003 | Kraus et al. .............. | 438/776 |
| 6,890,811 B1 * | 5/2005 | Hou et al. ................. | 438/216 |
| 2005/0153570 A1 * | 7/2005 | Matsuyama et al. ....... | 438/777 |

FOREIGN PATENT DOCUMENTS

| | | |
|---|---|---|
| JP | 9-45679 | 2/1997 |
| JP | 08085341 | * 10/1997 |
| JP | 10-50701 | 2/1998 |
| JP | 10-79509 | 3/1998 |
| JP | 10-223629 | 8/1998 |
| JP | 29-37817 | 6/1999 |
| JP | 11-214386 | 8/1999 |
| JP | P2002-64093 A | 2/2002 |

OTHER PUBLICATIONS

"S. M. Sze, VLSI Technology" McGraw-Hill, 1984, pp. 131-167.

* cited by examiner

*Primary Examiner*—Asok Kumar Sarkar
(74) *Attorney, Agent, or Firm*—McDermott Will & Emery LLP

(57) ABSTRACT

Part of a first oxide film formed by thermal oxidation is removed by etching. A second oxide film is formed in the part of substrate from which the first oxide film has been removed using heated nitric acid. The two oxide films are nitrided by a nitrogen plasma having a low energy so as to be first and second gate insulating films, i.e., oxynitride films, respectively.

19 Claims, 9 Drawing Sheets

METHOD FOR FABRICATING SEMICONDUCTOR DEVICE AND SEMICONDUCTOR DEVICE

BACKGROUND OF THE INVENTION

The present invention relates to a method for fabricating a semiconductor device and a semiconductor device, and particularly relates to a method for fabricating a semiconductor device including an oxide film which is formed by solution oxidation and, furthermore, into which nitrogen is introduced and the semiconductor device.

Among a plurality of transistors formed on a semiconductor substrate, for example, a transistor in a CMOS (complementary metal oxide semiconductor) device has a gate insulating film having a more and more reduced thickness for the purpose of improving the driving ability of a semiconductor device. In recent years, a gate insulating film having a thickness of 1–3 nm is required for such a transistor. On the other hand, in another transistor which is not required to perform a high speed operation but is required to use a relatively high voltage such as an input/output signal, a gate insulating film has to have a relatively great thickness in order to suppress a leakage current in the gate insulating film. In this case, a desired thickness of the gate insulating film is 7–10 nm. Since these transistors described above are formed in the semiconductor device, two or more different gate insulating films having different thicknesses have to be formed on the same substrate.

Conventionally, thermal oxidation (e.g., see S. M. Sze, *VLSI technology*, McGraw-Hill, 1984, pp.131–168) which allows formation of an oxide film with excellent properties as a gate insulating film has been mainly used in oxidizing a semiconductor device to form a gate insulating film. To form two different gate insulating films having different thicknesses on a semiconductor substrate, a method is used in which after a first gate insulating film has been formed by thermal oxidation, part of the first gate insulating film is removed by patterning and then a second gate insulating film is formed by thermal oxidation in a region of the semiconductor substrate from which the first gate insulating film has been removed. Moreover, besides thermal oxidation, use of various other methods for forming a gate insulating film has been examined (e.g., see Japanese Patent Publication No. 2937817, Japanese Unexamined Patent Publication No. 10-50701, Japanese Unexamined Patent Publication No. 10-223629, Japanese Unexamined Patent Publication No. 11-214386, and Japanese Unexamined Patent Publication No. 2002-64093).

As a technique for reducing the thickness of a gate insulating film for the purpose of improvement of the driving ability of a semiconductor device, a method in which nitrogen is introduced into a gate insulating film by annealing in nitrogen monoxide so as to reduce an electrical film thickness has been used. An electrical film thickness is a thickness measured in terms of electrostatic capacity. Even with the same physical thickness, the larger dielectric constant a film has, the smaller the thickness of the film is indicated. Oxynitride into which nitrogen is introduced has a larger dielectric constant than that of silicon dioxide. Therefore, by introducing nitrogen, an electrical film thickness is reduced, so that the driving ability of a transistor is improved. As a method for introducing nitrogen into a gate insulating film, i.e., a silicon dioxide film, a method using a plasma is known (e.g., Japanese Unexamined Patent Publication No. 10-79509).

Moreover, when nitrogen is introduced into a gate insulating film, as described in Japanese Unexamined Patent No. 10-79509, a dopant with which a gate electrode has been doped is prevented from reaching a substrate through the gate insulating film. This will be described further in detail.

In a CMOS transistor, a dual gate structure in which boron is introduced as a dopant into a gate electrode of a p-channel transistor and phosphorous is introduced as a dopant into a gate electrode of an n-channel transistor is used. Boron has a larger diffusion constant than that of phosphorous and thus is diffused in a gate insulating film through thermal treatment performed after the transistor has been formed. Thus, boron easily reaches a channel region. This phenomenon is called boron leakage and causes a large change in a threshold voltage, reduction in the driving ability of a transistor and the like. Especially, the smaller thickness a gate insulating film has, the larger the boron leakage becomes. However, if nitrogen is introduced into a gate insulating film, the boron leakage can be suppressed.

Problems that the Invention is to Solve

In a method for forming a plurality of gate insulating films according to the known method, a first gate insulating film is etched through wafer cleaning performed after a photoresist has been removed, so that the thickness of the first gate insulating film is once reduced. Then, when a second gate oxide film is formed, the thickness of the first insulating film is increased this time. This causes reduction in controllability of the thickness of the first gate insulating film, and also, in terms of film quality, it is very difficult to control the film quality of the first insulating film which has undergone through etching and additional oxidation.

Furthermore, assume that three different gate insulating films having different thicknesses (e.g., 7 nm, 3 nm and 1.5 nm) are formed. A second gate insulating film has a relatively small thickness, i.e., 3 nm. Thus, the second gate insulating film is more largely influenced by reduction and increase in a film thickness caused in forming a third gate insulating film having a thickness of 1.5 nm than a first gate insulating film having a thickness of 7 nm. That is to say, it is very difficult to control the thickness of the second gate insulating film so that the second gate insulating film has a constant thickness at any time. Accordingly, the ratio of an additional portion formed through additional oxidation to the entire thickness of the second gate insulating film is increased. Therefore, the quality of the entire second gate insulating film is largely reduced.

Moreover, assume that the thickness of a gate insulating film is reduced. When an oxynitride film is obtained as a gate insulating film according to a method described in Japanese Unexamined Patent Publication No. 10-79509, the electron energy of a nitrogen plasma is very high, i.e., about 50–1000 eV and this becomes a problem. For example, assume that a gate insulating film into which nitrogen is to be introduced has a thickness of 1.5 nm. Even when a nitrogen plasma has an energy of the lower limit of the energy range described in Japanese Unexamined Patent Publication No. 10-79509, i.e., 50 eV, the nitrogen plasma easily goes through the gate insulating film to nitride a silicon substrate as well. As a result, even though the thickness of the gate insulating film was about 1.5 nm before an exposure to the nitrogen plasma, the silicon substrate has been nitrided after the exposure to the nitrogen plasma, so that the total thickness of part of the gate insulating film which has been nitrided is over 2 nm. Thus, even though an oxide film having a thickness of 1.5 nm is formed, an oxynitride film having a small thickness can not be obtained. As a matter of course, the known method can not be used with a gate insulating film having a thickness of about 1 nm. Furthermore, when a nitrogen plasma has a higher energy than 50 eV, use of the known method is out of question. Nnitriding of a silicon substrate causes not only increase in a film thickness but also reduction in a driving force resulting from reduction in mobility or reduction in reliability.

The present invention has been devised in view of the above-described problems. It is therefore an object of the present invention is to provide a method for a fabricating a semiconductor device in which a gate insulating film having a small thickness allowing a high-speed operation can be formed with excellent film thickness control and furthermore, nitriding can be performed so as not to reach a semiconductor substrate, and a semiconductor device which includes a gate insulating film having a small thickness and excellent quality and in which a semiconductor substrate is hardly nitrided.

SUMMARY OF THE INVENTION

A first method for fabricating a semiconductor device according to the present invention is a method for fabricating a semiconductor device including the steps of: forming an oxide film, using a solution including an oxidizer, on a surface of a silicon layer provided at least in part of a semiconductor substrate; and making the oxide film into an oxynitride film by exposing the oxide film to a plasma having an electron energy of 5 eV or less and containing nitrogen.

The first method further includes, before the step of forming an oxide film, the step of forming an isolation region using STI process.

A second method for fabricating a semiconductor device according to the present invention is a method for fabricating a semiconductor device including the steps of: removing part of a first oxide film formed on a surface of a semiconductor substrate; forming a second oxide film, using a solution including an oxidizer, in part of the semiconductor substrate from which the first oxide film has been removed; and making each of the first and second oxide films into an oxynitride film by exposing the first and second oxide films to a plasma having an electron energy of 5 eV and containing nitrogen.

The second method further includes: after the step of forming a second oxide film, the step of removing part of the second or first oxide film; and the step of forming a third oxide film, using a solution including an oxidizer, in part of the semiconductor substrate from which the first or second oxide film has been removed. In the step of making each of the first and second oxide films into an oxynitride film, the third oxide film is also made into an oxynitride film.

The thickness of the second oxide film is smaller than that of the first oxide film.

In a preferable embodiment of the present invention, the first oxide film is formed by thermal oxidation or plasma oxidation.

In another preferable embodiment of the present invention, the first oxide film is formed using a perchloric acid solution.

The ion density of the plasma is not less than $5 \times 10^9$ cm$^{-3}$ and not more than $1 \times 10^{12}$ cm$^{-3}$.

The temperature of the plasma is not less than 0° C. and not more than 500° C.

The plasma is selected one from the group consisting of an inductively coupled plasma, a magnetron plasma, a helicon wave plasma and a surface wave plasma.

The oxidizer is nitric acid.

The second method further includes, after the step of making the oxide film into an oxynitride film, the step of performing thermal treatment to the semiconductor substrate in an atmosphere containing oxygen.

In the step of performing thermal treatment, a process temperature is not less than 800° C. and not more than 1100° C. and a process time is not less than 10 seconds and not more than 120 seconds.

A first semiconductor device according to the present invention is a semiconductor device including: a semiconductor substrate; a gate insulating film formed on the semiconductor substrate; and a gate electrode formed on the gate insulating film. In the first semiconductor device, the gate insulating film contains silicon dioxide as a main component and nitrogen and has a physical thickness of not less than 0.3 nm and not more than 3 nm, the concentration of the nitrogen contained in the gate insulating film is maximum at a distance of 1 nm or less in the depth direction from a surface of the gate insulating film on which the gate electrode is formed, the maximum concentration of the nitrogen is not less than 5 atomic % and not more than 100 atomic %, and the nitrogen concentration at the interface between the semiconductor substrate and the gate insulating film is 1.5 atomic % or less.

A second semiconductor device according to the present invention is a semiconductor device including: a semiconductor substrate; a gate insulating film formed on the semiconductor substrate; and a gate electrode formed on the gate insulating film. In the second semiconductor device, the electrical thickness of the gate insulating film measured by a capacitance-voltage measurement is 0.3 nm or more, the electrical thickness of the gate insulating film is not less than 0% and not more than 90% of the electrical thickness of a silicon dioxide film of which the physical thickness is the same as the physical thickness of the gate insulating film, and a leakage current flowing in the gate insulating film when a driving voltage of not less than 0.5 V and not more than 2 V is applied is not less than $\frac{1}{10000}$ and not more than $\frac{1}{3}$ of a leakage current flowing in the silicon dioxide film.

The gate insulating film contains silicon dioxide as a main component and nitrogen.

The electrical thickness of the gate insulating film is not less than 0.3 nm and not more than 3 nm.

A third semiconductor device according to the present invention is a semiconductor device including: a semiconductor substrate; a gate insulating film formed on the semiconductor substrate; and a gate electrode formed on the gate insulating film. In the third semiconductor device, the gate insulating film contains silicon dioxide as a main component and nitrogen and has a physical thickness of not less than 0.3 nm and not more than 3 nm, and the silicon dioxide is formed using a solution containing an oxidizer.

DESCRIPTION OF THE PREFERRED EMBODIMENTS

Figure 1A:
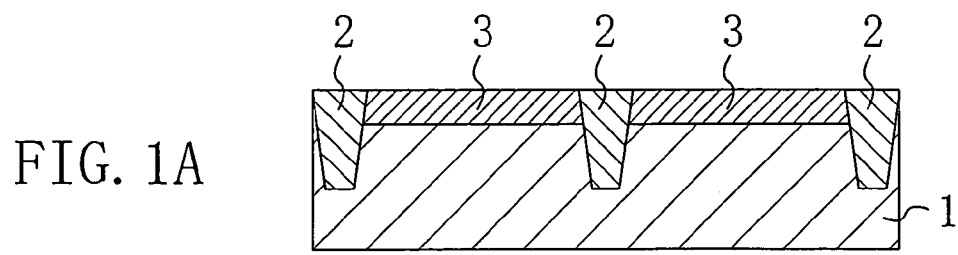
FIGS. 1A through 1E are cross-sectional views schematically illustrating respective process steps according to a first example of the present invention.

First, details on how the present inventor examined reduction in the thickness of a gate oxide film (i.e., insulating film) and plasma nitriding and then reached the present invention will be described.

When three different gate oxide films having different thicknesses are formed by thermal oxidation, the thickness of a first gate oxide film having the largest thickness and serving as an input/output system is about 7 nm. Even after the first gate oxide film has been etched by about 0.4 nm through wafer cleaning after removal of a photoresist and then the thickness of the first gate oxide film has been increased by 0.2 nm in forming a second gate oxide film, the amount of a change in the thickness of the first gate oxide film is about 3% of the original thickness thereof. However, for example, with the second gate oxide film of a thickness of 2.8 nm and the third gate oxide film of a thickness of 1.6 nm, the second gate oxide film has been etched by about 0.4 nm through wafer cleaning after the removal of a photoresist and then the thickness of the second gate oxide film has been increased by 0.1 nm through oxidation of 1.6 nm in forming a third gate oxide film. As a result, the thickness of the second gate oxide film, i.e., a thickness of 2.8 nm, is reduced by about 0.3 nm in total. The reduction amount corresponds to 20% of the entire thickness of the second gate oxide film. Therefore, a very large influence is given to film quality as well as film thickness control.

Furthermore, a very thin gate insulating film having a thickness of 1.6 nm, i.e., a third gate oxide film, a natural oxide film having a thickness of about 0.3–1 nm and existing on a surface of an active region has to be removed with hydrofluoric acid. Reasons for this are as follows. First, an oxide film, for example, having a thickness of 1.6 nm is considered to include a layer having only about five to eight atoms. Thus, if a natural oxide film is not removed, it is very difficult to control the thickness of the third oxide film to be constant. Moreover, although the natural film corresponds to several tens % of the thickness of the third gate oxide film, the natural oxide film does not have excellent properties which are required for a gate insulating film. For those reasons, the removal of the natural oxide film on the active region is necessary.

In this case, if the removal of a natural oxide film is performed using hydrofluoric acid, the second oxide film is further etched by about 1 nm, so that the thickness of the second gate oxide film becomes about 1.5 nm, i.e., half of the original thickness. To finish a second gate oxide film with a thickness of 2.8 nm as designed, the thickness of the second gate oxide film has to be made to initially have a thickness of 4.0 nm in consideration of the etching amounts described above.

Moreover, in high temperature treatment such as thermal oxidation, it is very difficult to form a third oxide film having a very small thickness, i.e., a thickness of 1.6 nm, with excellent controllability and uniformity. Therefore, apart from laboratory experiments, in manufacturing processes, it is considered very difficult to form, in order to further reduce the thickness of the third oxide film, a gate oxide film having a thickness of 1 nm or less by thermal oxidation according to the known method.

Thus, it has been clearly shown that the known method has a problem in which the thickness of an already formed gate oxide film is reduced through wafer cleaning performed before forming another gate oxide film, a problem in which the thickness of the already formed gate oxide film is increased due to additional thermal oxidation, and furthermore, a problem in which it is difficult to control the thickness and quality of a film in forming a very thin gate oxide film having a thickness of 1.5 nm or less.

Next, as a comparative example, an examination of the process step of forming a gate oxide film by thermal oxidation and then performing nitriding using a plasma will be described with reference to the accompanying drawings.

FIGS. 8A through 8E are cross-sectional views illustrating respective process steps for forming a dual oxide (two different gate insulating films having different thicknesses) according to a comparative example.

Figure 8A:
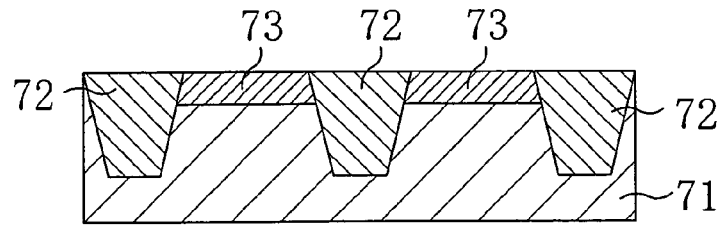
FIGS. 8A through 8E are cross-sectional views schematically illustrating respective process steps according to a comparative example.

First, FIG. 8A illustrates how a first gate oxide film 73 serving as a high voltage system is formed on a silicon substrate 71 in which an isolation region 72 is formed using STI (shallow trench isolation) process by thermal oxidation. The first gate oxide film 73 is formed so as to have a thickness of 7 nm.

Figure 8B:
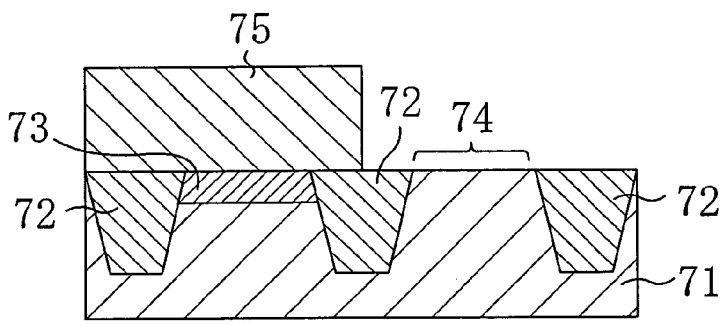

Next, as shown in FIG. 8B, part of the first gate oxide film 73 on a second gate insulating film formation region 74 (i.e., a first oxide film removal region) of the silicon substrate is removed with a hydrofluoric acid or the like. In removing the part of the first gate oxide film 73, a photoresist 75 is used as a mask. Thereafter, through a wet cleaning process for removing the photoresist 75 and a wet cleaning process performed before forming a second gate oxide film 76, the thickness of the gate oxide film 73 is reduced by about 0.4 nm from the original thickness of 7 nm.

Figure 8C:
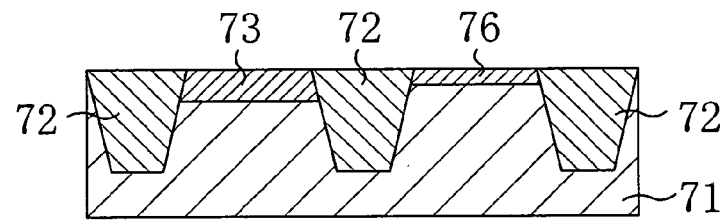

Thereafter, as shown in FIG. 8C, a second gate oxide film 76 serving as a low voltage system and having a thickness of 2.2 nm is formed by thermal oxidation. At this time, the thickness of the first gate oxide film is increased by about 0.2 nm to be about 6.8 nm.

Figure 8D:
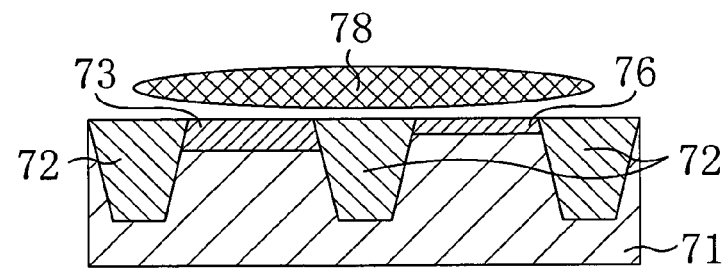

Then, as shown in FIG. 8D, the first and second gate oxide films 73 and 76 are exposed to a nitrogen plasma 78 having an electron energy of about 50–1000 eV so that nitrogen is introduced into the first and second gate oxide films 73 and 76. Thus, the first and second gate oxide films 73 and 76 are made into first and second gate insulating films 81 and 82, respectively.

Figure 8E:
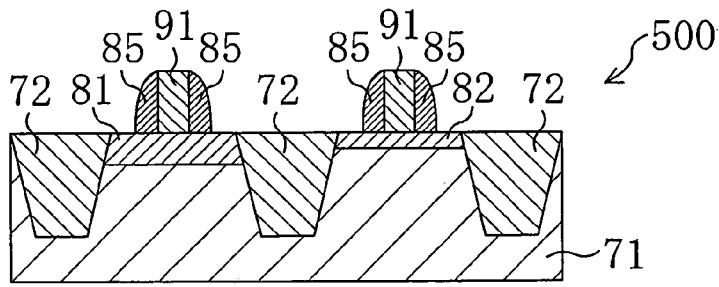

Thereafter, as shown in FIG. 8E, first and second gate electrodes 91 and 92 are formed on the first and second gate insulating films 81 and 82, respectively. Then, through the process steps of forming an LDD (lightly doped drain), a sidewall 85, and source and drain, a semiconductor device 500 including a plurality of transistors (two transistors in this embodiment) is formed.

In FIG. 9, the SIMS (secondary-ion mass spectrometry) profiles of the nitride concentrations of the first and second gate insulating films 81 and 82 formed in the above-described manner are shown under the assumption that the power and time of the plasma 78 are adjusted so that a peak concentration is 5 atomic %. The electron energy of the plasma 78 at this time, i.e., one fifth of the lower limit electron energy of the plasma described in Japanese Unexamined Patent Publication No. 10-79509.

Figure 9B:
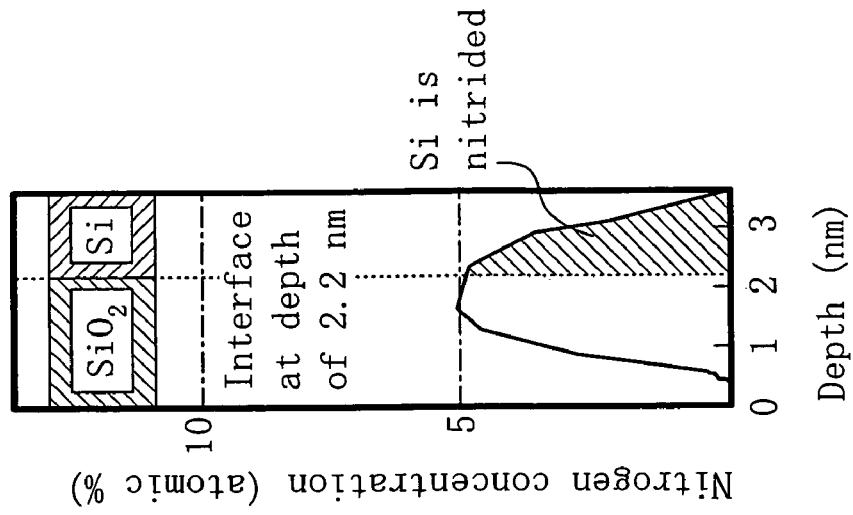
FIGS. 9A and 9B are graphs showing distribution of nitrogen concentration in the film thickness direction for gate insulating films formed in the comparative example.
Figure 9A:
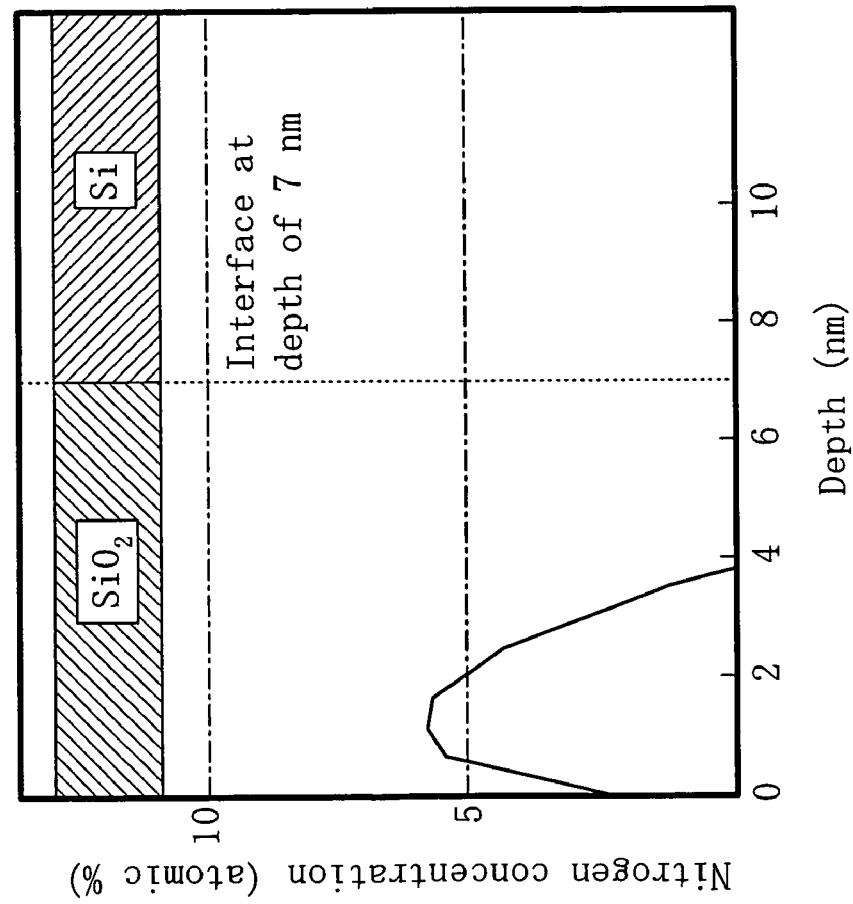

As shown in FIG. 9A, the nitrogen concentration distribution of the first gate insulating film 81 (having a thickness of 7 nm) has a peak at a distance of about 2 nm from a surface of the first gate insulating film 81 (i.e. the interface with the gate electrode 91) and the nitrogen concentration is almost 0 around 4 nm. Therefore, in the case of the first gate insulating film 81 having a thickness of 7 nm, even if the known technology is used, the nitrogen concentration around the interface between the first gate insulating film 81 and the silicon substrate 71 is almost 0. Therefore, the silicon substrate 71 is no way nitrided.

However, as shown in FIG. 9B, the nitrogen concentration distribution of the second gate insulating film 82 (having a very small thickness, i.e., 2.2 nm) has a peak at a depth of 2 nm from the interface with the gate electrode 92. This peak position substantially corresponds to the interface between the second gate insulating film 82 and the silicon substrate 71 and shows that a tail of nitrogen extends in the silicon substrate 71. This is because the energy of the nitrogen plasma 78 is not as low as that required for the thickness of the second gate insulating film 82, so that the nitrogen plasma 78 goes through the second gate insulating film 82 to nitride the silicon substrate 71. In this state, the electrical thickness of the second gate insulating film 82 measured by a high-frequency CV measurement (a capacitance-voltage measurement) includes a serial capacitance formed by nitriding the silicon substrate 71 and is greater than the electrical thickness of the second gate insulating film 82 which does not includes a serial capacitance. Thus, effects of reduction in and nitriding of the thickness of the gate oxide film 76 can not be utilized.

Then, the present inventor conducted various examinations based on the above-described findings. As a result, the present inventor has reached the present invention relating to a gate insulating film with excellent film controllability, uniformity of film thickness and film quality.

Hereinafter, embodiments of the present invention will be described. Note that the present invention is not limited to the following embodiments.

Embodiment 1

EMBODIMENT 1 relates to a semiconductor device including two different gate insulating films having different thicknesses.

First, a substrate including a silicon layer at least on a surface thereof is prepared. The substrate may be a silicon substrate or an SOI substrate. Moreover, if an epitaxial wafer in which a surface layer of a silicon layer is an epitaxial layer is used, no deficiency is generated in the surface layer. Accordingly, a gate insulating film with excellent film quality can be preferably formed.

Next, an isolation region is formed in the substrate using STI process.

Thereafter, a first oxide film for dealing with a relatively high voltage signal such as an input/output signal is formed on the surface of the substrate by thermal oxidation. The thickness of the oxide film is about 7–10 nm. Note that a method for forming a first oxide film is not limited to thermal oxidation but may be plasma oxidation, oxidation using perchloric acid solution or the like. With these oxidation methods, a relatively thick oxide film can be formed in a short time and the film quality of an obtained oxide film is good. Therefore, these methods are preferable as methods for forming a first oxide film.

Thereafter, a photoresist is provided as a mask on part of the first oxide film which is to be left as a first gate insulating film and then other part of the first oxide film is removed by etching.

After the photoresist has been removed, the substrate is immersed in heated nitric acid serving as an oxidizer and then a second oxide film is formed by solution oxidation in part of the substrate from which the first oxide film has been removed. Here, instead of immersing the substrate in heated nitric acid, heated nitric acid may be sprayed to the substrate or be made to flow on the substrate. The thickness of the second oxide film is about 0.3–2 nm. Note that through the solution oxidation, the thickness of the first oxide film is hardly increased. In this oxidation process, as an oxidizer, heated nitric acid is preferably used. However, perchloric acid may be used.

Next, the substrate in which the two oxide films have been formed is placed at room temperature (i.e., about 20° C.) and then the substrate is exposed to a plasma containing nitrogen having an electron energy of 5 eV or less to nitride the substrate. In this plasma nitriding, the lower limit of the energy of the plasma is a level at which a plasma state can be maintained. As the plasma, an inductively coupled plasma, a magnetron plasma, a helicon wave plasma or a surface wave plasma is preferable. If the electron energy of the plasma is not less than 0.5 eV and not more than 3 eV, introduction of nitrogen further to the substrate under the second oxide film can be reliably avoided. Therefore, the electron energy of not less than 0.5 eV and not more than 3 eV is more preferable. The density of nitrogen ions in the plasma is preferably not less than $5\times10^9$ cm$^{-3}$ and not more than $1\times10^{12}$ cm$^{-3}$.

Thereafter, the nitrided substrate is subjected to thermal treatment for 10–120 seconds in an oxygen atmosphere in which a temperature is set to be not less than 800° C. and not more than 1100° C. The thermal treatment is performed so that Si reliably binds to N. Note that in this thermal treatment, the atmosphere may be a low pressure oxygen atmosphere. Moreover, although effects are slightly reduced, the thermal treatment may be performed using a non-oxidizing gas such as nitrogen and argon.

Next, a polysilicon film has been deposited on the substrate and then an impurity introduction and patterning are performed to form gate electrodes.

According to this embodiment, a second oxide film, i.e., a very thin oxide film, can be formed so as to have excellent reproducibility and uniformity of film thickness, and even an oxide film having a thickness of 1.6 nm or less, which is difficult to be formed by thermal oxidation, can be formed in a simple manner. Moreover, an oxide film formed by solution oxidation has excellent film quality and also nitriding is performed using a low-energy high-density nitrogen plasma, so that the electrical thickness of the oxide film measured by a capacitance-voltage measurement can be reduced. Therefore, a leakage current can be suppressed to a low level. Note that although the electrical thickness of a silicon dioxide film is in general a thickness obtained by adding 0.2–0.3 nm to the physical thickness of the silicon dioxide film, the electrical thickness of the nitrided oxide film of this embodiment is substantially the same as or slightly larger than the physical thickness of the nitrided oxide film.

Moreover, the gate insulating film of this embodiment contains silicon dioxide as a main component and nitrogen.

To contain silicon dioxide as a main component and nitrogen means that the mole percent of nitrogen to silicon contained in silicon dioxide is not less than 1% and not more than 50%. Therefore, it has been shown that the gate insulating film is not a silicon nitride film.

The isolation region of this embodiment is formed using STI process. STI process is a method of burying an insulator into a silicon layer. In a high temperature process such as thermal oxidation, an oxidizer even oxidizes an inner wall of the isolation region. Due to the oxidation of the inner wall of the isolation region, cubical expansion occurs in the isolation region, so that a stress is generated. Then, if in order to relax the stress, a temperature is increased to make a viscous flow, an impurity is diffused this time. This is also not preferable. In this embodiment, however, the second oxide film is formed by solution oxidation at a relatively low temperature. Thus, the oxidizer is not diffused in the isolation region and the inner wall of the isolation region is not oxidized, so that no stress is generated. Therefore, there is no need to perform stress relaxation.

Moreover, in this embodiment, the semiconductor substrate may be a substrate containing Si at least on the surface thereof. For example, a SiGe substrate may be used.

Embodiment 2

EMBODIMENT 2 is different from EMBODIMENT 1 in that three different oxide films having different thicknesses are formed. EMBODIMENT 2 will be described with a focus on this different point of EMBODIMENT 2 from EMBODIMENT 1.

First and second oxide films are formed in a substrate as in the same manner as in EMBODIMENT 1.

Next, a photoresist is provided as a mask so as to cover parts of the first and second oxide films which are to be left as first and second gate insulating films, respectively, and then other parts of the first oxide film and/or the second oxide film are removed by etching.

After the photoresist has been removed, the substrate is immersed in heated nitric acid serving as an oxidizer and then a third oxide film is formed in parts of the substrate from which the first oxide film and/or the second oxide film have been removed by solution oxidation. The thickness of the third oxide film is preferably smaller than that of the second oxide film, i.e., about 0.3–3 nm.

Thereafter, nitriding and gate electrode formation are performed in the same manner as in EMBODIMENT 1.

In this embodiment, the second and third oxide films can be formed so as to have excellent reproducibility and uniformity of film thickness, and even an oxide film having a thickness of 1.6 nm or less, which is difficult to be formed by thermal oxidation, can be formed in a simple manner. Specifically, when the third oxide film is formed, the second oxide film is only etched and the thickness of the second film is not increased. Thus, the thickness of the second oxide film can be controlled in a simple manner, and also the quality of the second oxide film can be kept good. Moreover, an oxide film formed by solution oxidation has excellent film quality and also nitriding is performed using a low-energy high-density nitrogen plasma, so that the electrical thickness of the oxide film measured by a capacitance-voltage measurement can be reduced. Therefore, a leakage current can be suppressed to a low level.

EXAMPLES

Hereinafter, examples according to the present invention will be described with reference to the accompanying drawings. In the following drawings, each component having substantially the same function is identified by the same reference numeral for the purpose of simplification.

First Example

A first example of the present invention which relates to a semiconductor device 100 including two different gate insulating films 11 and 12 having different thicknesses will be described with reference to cross-sectional views shown in FIG. 1 and schematically illustrating respective process steps for fabricating a semiconductor device.

First, as shown in FIG. 1A, in an epitaxial wafer (a semiconductor substrate) 1 in which an epitaxial layer having a resistivity of 10–15 Ωcm and a thickness of 5 μm was formed on a silicon substrate of which the principal surface was the (100) plane and which has a p-type resistivity of 0.01–0.02 Ωcm, isolation regions 2 having a depth of 250 nm were formed using STI (shallow trench isolation) process, so that an isolation width between adjacent two of the isolation regions 2 was 200 nm. Furthermore, well formation and introduction of an impurity into an active region by ion implantation for adjusting a threshold voltage were performed. This semiconductor substrate 1 was cleaned using an SC-1 cleaning liquid ($NH_4OH:H_2O_2:H_2O$) of a temperature of 50° C. and then a natural oxide film was removed from the surface of the substrate using diluted hydrofluoric acid. Thereafter, in an RTP apparatus, thermal oxidation was performed at a temperature of 1050° C. and in an $H_2/O_2$ mixed atmosphere to form a first gate oxide film (a first oxide film) 3 having a thickness of 7.2 nm. Note that the cleaning method using an SC-1 cleaning liquid is a known cleaning method called "RCA cleaning" (W. Kern and D. A. Plutien, *RCA review* 31, p. 187, 1970).

Figure 1B:
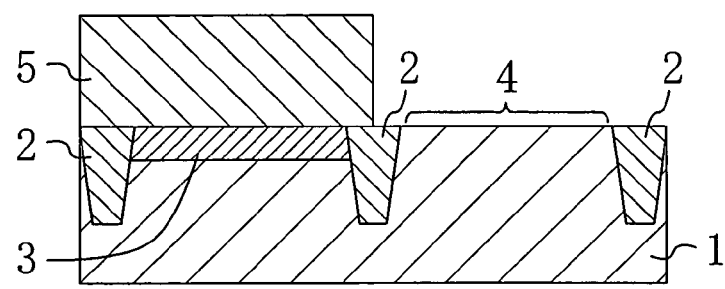

In this case, the first oxide film 3 was grown to extend in each of regions into which the substrate was divided by the isolation regions 2, i.e., a region of the substrate in which a first gate insulating film 11 was to be formed and a region of the substrate in which a second gate insulating film 12 was to be formed. Thereafter, as shown in FIG. 1B, a photoresist 5 was formed as a mask on the region in which a first gate insulating film 11 was to be formed, and then etching using diluted hydrofluoric acid was performed to remove part of the first oxide film 3 located on the region in which a second gate insulating film 12 was to be formed.

Figure 1C:
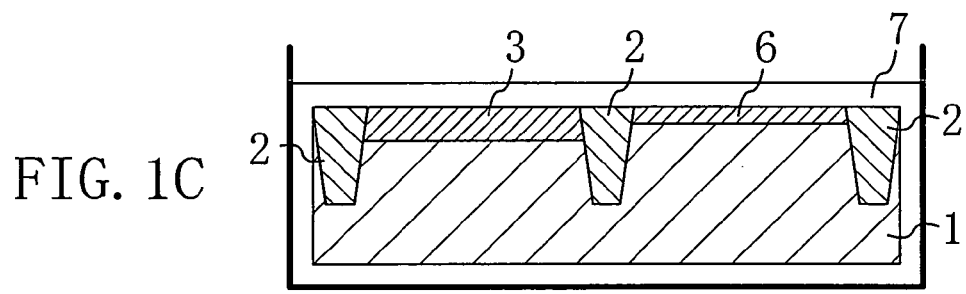

Next, as shown in FIG. 1C, after the photoresist 5 was removed using a 130° C. mixed solution of sulfuric acid and hydrogen peroxide solution, the substrate was immersed in 50% heated nitric acid 7 of a temperature of 80° C. for 30 minutes and then an $SiO_2$ film, i.e., a second gate oxide film (a second oxide film) 6 having a thickness of 1.4 nm, was formed in a region 4 of the substrate from which the first oxide film 3 had been removed. The film thickness uniformity of the second oxide film 6 measured by ellipsometry was 0.01 nm (σ) in a 200 mm wafer surface. At this time, on the other hand, the average thickness of the first oxide film 3 was 7 nm.

Figure 1D:
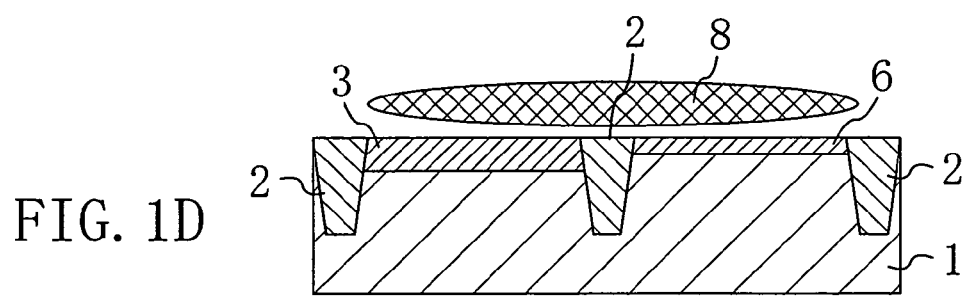

Thereafter, as shown in FIG. 1D, the first and second oxide films 3 and 6 were exposed for 20 seconds to a nitrogen plasma 8 generated by an inductively coupled plasma (at 12.56 MHz and of 500 W) at room temperature (i.e., 30° C.) and having an electron energy of 1.0 eV. The temperature then was room temperature (30° C.) and the ion density of the nitrogen plasma 8 was $5\times10^{10}$ cm$^{-3}$. Note that in this exposure, helium was used as an addition gas. Through the exposure to the nitrogen plasma 8, the first and second oxide films 3 and 6 were made into oxynitride films 11 and 12, i.e., first and second gate insulating films.

Subsequently, thermal treatment was performed for 20 seconds at a temperature of 1000° C. and in an oxygen atmosphere of 5 Torr.

Figure 1E:
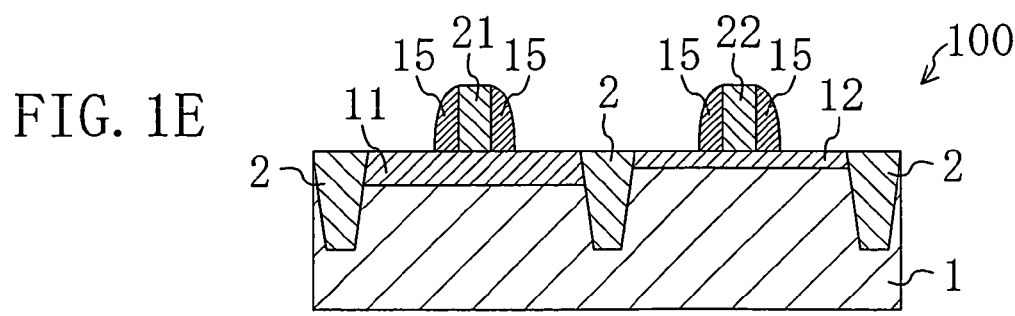

Next, as shown in FIG. 1E, a polycrystalline silicon film was deposited to a thickness of 150 nm at 620° C., an N-channel gate and a P-channel gate were doped with phosphorous and boron, respectively, and then patterning using a photolithography and dry-etching were performed in a known manner. Thus, gate electrodes 21 and 22 were formed.

Thereafter, ion implantation into an LDD region was performed and, furthermore, low pressure CVD using TEOS (tetra ethyl ortho silicate) at a temperature of 650° C. and etch back were performed, thereby forming a sidewall 15. Then, arsenic ions and boron ions were implanted into the N-channel and the P-channel, respectively, thereby forming source/drain regions. Thereafter, regular process steps of forming an interlevel film and an interconnect were performed.

When the respective electrical thicknesses of the first and second gate insulating films 11 and 12 formed in the above-described manner were measured by a high-frequency CV measurement (a capacitance-voltage measurement), the first gate insulating film had a 7.2 nm electrical thickness and the second gate insulating film had a 1.4 nm electrical thickness. Note that the measurement was conducted with the silicon dioxide having a dielectric constant of 3.9. The physical thicknesses of the first gate insulating film 11 and the second gate insulating film 12 were 7.0 nm and 1.4 nm, respectively. Note that when a high-frequency CV measurement was conducted for a silicon dioxide film having a physical thickness of 1.4 nm, the electrical thickness thereof was 1.6 nm. Moreover, the respective nitrogen profiles of the first and second gate insulating films 11 and 12 in the depth direction were measured by SIMS. From the measurement, a nitrogen concentration distribution having a peak of 10 atomic % at a distance of 0.5 nm from each of surfaces of the first and second gate insulating films 11 and 12 on which the gate electrodes 21 and 22 were formed, respectively was confirmed. Moreover, the nitrogen concentration of an interface portion between the first gate insulating film 11 and the semiconductor substrate 1 was 0.01 atomic % or less and the nitrogen concentration of an interface portion between the second gate insulating film 12 and the semiconductor substrate was 1.0 atomic % or less. The semiconductor substrate in each of the interface portions was hardly nitrided.

Second Example

A second example of the present invention which relates to a semiconductor device 200 including a gate insulating film 32 will be described with reference to cross-sectional views shown in FIG. 2 and schematically illustrating respective process steps for fabricating a semiconductor device.

Figure 2A:
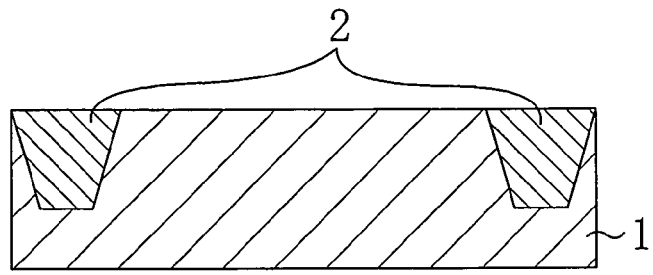
FIGS. 2A through 2D are cross-sectional views schematically illustrating respective process steps according to a second example of the present invention.

First, as shown in FIG. 2A, in an epitaxial wafer (a semiconductor substrate) 1 in which an epitaxial layer having a resistivity of 10–15 Ωcm and a thickness of 5 μm was formed on a silicon substrate of which the principal surface was the (100) plane and which has a p-type resistivity of 0.01–0.02 Ωcm, isolation regions 2 having a depth of 250 nm were formed using STI (shallow trench isolation) process, so that an isolation width between adjacent two of the isolation regions 2 was 200 nm. Furthermore, well formation and introduction of an impurity into an active region by ion implantation for adjusting a threshold voltage were performed.

Figure 2B:
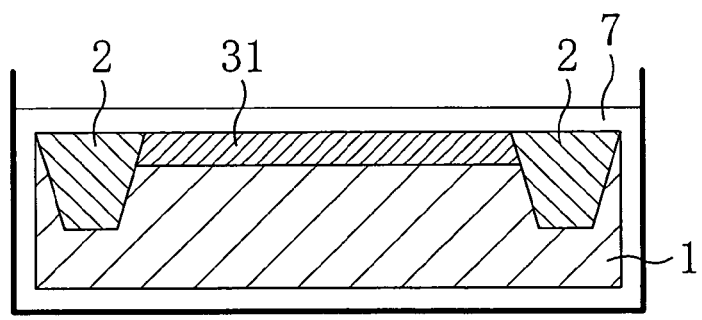

Thereafter, as shown in FIG. 2B, the semiconductor substrate 1 was cleaned using an SC-1 cleaning liquid (NH$_4$OH:H$_2$O$_2$: H$_2$O) of a temperature of 50° C. and then a natural oxide film was removed from the surface of the substrate using diluted hydrofluoric acid. Then, the substrate was immersed in 50% heated nitric acid 7 of a temperature of 80° C. for 10 minutes to deposit an SiO$_2$ film, i.e., a gate oxide film 31 having a thickness of 1.1 nm. The thickness of the gate oxide film 31 was measured by spectroscopic ellipsometry. At this time, the film thickness distribution in the wafer surface was 0.01 nm (σ).

Figure 2C:
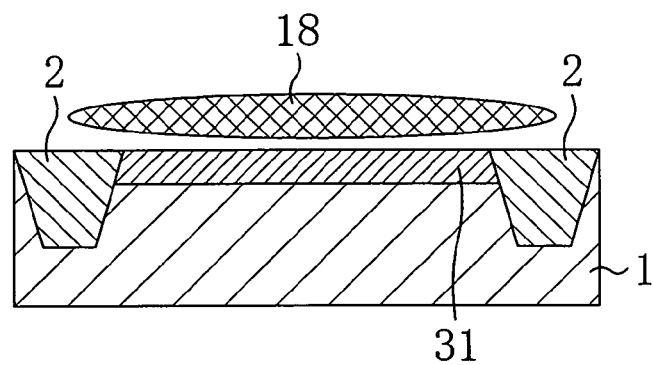

Thereafter, as shown in FIG. 2C, the gate oxide film 31 was exposed for 15 seconds to a nitrogen plasma 18 generated by an inductively coupled plasma at 13.56 MHz and of 300 W so that the gate oxide film 31 was made into an oxynitride film 32. The temperature then was room temperature (30° C.) and the ion density of the nitrogen plasma 18 was $3\times10^{10}$ cm$^{-3}$. Note that in this exposure, the plasma was generated using only nitrogen without any addition gas. The electron energy was estimated to be 1 eV or less.

Figure 2D:
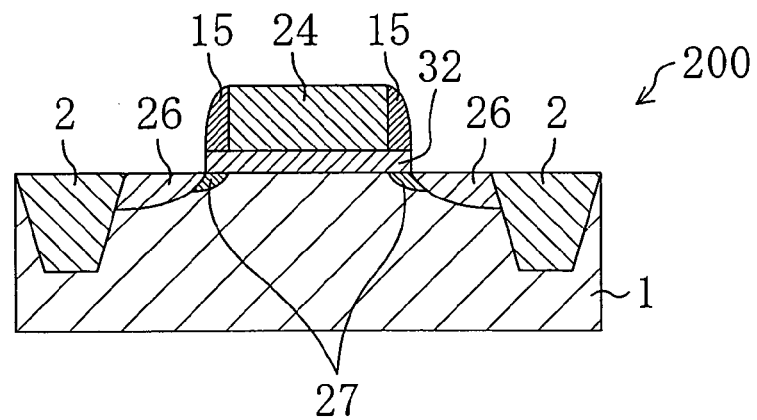

Thereafter, as shown in FIG. 2D, a polycrystalline silicon film was deposited to a thickness of 150 nm at a temperature of 620° C., an N-channel gate or a P-channel gate was doped with phosphorous or boron, and then patterning using a photolithography and dry-etching were performed in a known manner. Thus, a gate electrode 24 was formed.

Then, ion implantation into LDD regions 27 was performed and, furthermore, low pressure CVD using TEOS (tetra ethyl ortho silicate) at a temperature of 650° C. and etch back were performed, thereby forming a sidewall 15. Then, arsenic ions and boron ions were implanted into the N-channel and the P-channel, respectively, thereby forming source/drain regions 26. Thereafter, regular process steps of forming an interlevel film and an interconnect were performed.

When the electrical thickness of the gate insulating film 32 formed in the above-described manner was measured by a high-frequency CV measurement (a capacitance-voltage measurement), the electrical thickness thereof was 1.1 nm. The physical thickness of the gate insulating film 32 was 1.1 nm. Note that when a high-frequency CV measurement was conducted for a silicon dioxide film having a physical thickness of 1.1 nm, the electrical thickness thereof was 1.3 nm. Moreover, the nitrogen profile of the gate insulating film 32 in the depth direction was measured by SIMS. From the measurement, a nitrogen concentration distribution having a peak of 8 atomic % at a distance of 0.5 nm from surfaces of the gate insulating film 32 on which the gate electrode 24 was formed was confirmed. Moreover, the nitrogen concentration of an interface portion between the gate insulating film 32 and the semiconductor substrate 1 was 1.0 atomic %. This showed that the semiconductor substrate 1 was hardly nitrided.

Third Example

A third example of the present invention which relates to a semiconductor device 300 including three different gate insulating films 11, 12 and 13 having different thicknesses will be described with reference to cross-sectional views shown in FIGS. 3 and 4 and schematically illustrating respective process steps for fabricating a semiconductor device.

Figure 3A:
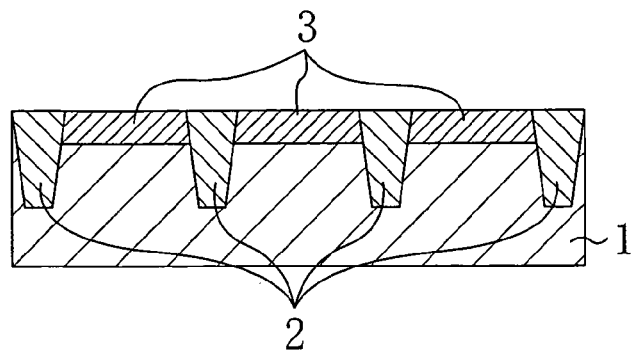
FIGS. 3A through 3D are cross-sectional views schematically illustrating the first half of respective process steps according to a third example of the present invention.

First, as shown in FIG. 3A, in an epitaxial wafer (a semiconductor substrate) 1 in which an epitaxial layer having a resistivity of 10–15 Ωcm and a thickness of 5 μm was formed on a silicon substrate of which the principal surface was the (100) plane and which a p-type resistivity of 0.01–0.02 Ωcm, isolation regions 2 having a depth of 250 nm were formed using STI (shallow trench isolation) process, so that an isolation width between adjacent two of the isolation regions 2 was 200 nm. Furthermore, well formation and introduction of an impurity into an active region by ion implantation for adjusting a threshold voltage were performed. This semiconductor substrate 1 was cleaned using an SC-1 cleaning liquid ($NH_4OH:H_2O_2:H_2O$) of a temperature of 50° C. and then a natural oxide film was removed from the surface of the substrate using diluted hydrofluoric acid. Thereafter, in an RTP apparatus, thermal oxidation was performed at a temperature of 1050° C. and in an $H_2/O_2$ mixed atmosphere to form a first gate oxide film (a first oxide film) 3 having a thickness of 5.5 nm.

Figure 3B:
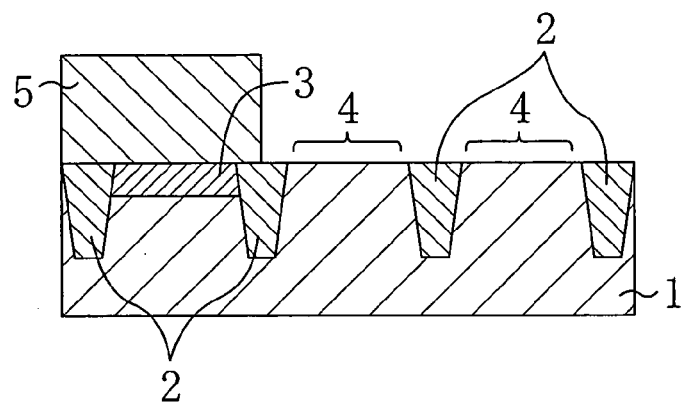

In this case, the first oxide film 3 was grown to extend in all of regions into which the substrate was divided by the isolation regions 2, i.e., a region of the substrate in which a first gate insulating film 11 was to be formed, a region of the substrate in which a second gate insulating film 12 was to be formed, and a region of the substrate in which a third gate insulating film 13 was to be formed. Thereafter, as shown in FIG. 3B, a photoresist 5 was formed as a mask on the region in which a first gate insulating film 11 was to be formed, and then etching using diluted hydrofluoric acid was performed to remove parts of the first oxide film 3 located on the region in which a second gate insulating film 12 was to be formed and the region in which a third gate insulating film 13 was to be formed.

Figure 3C:
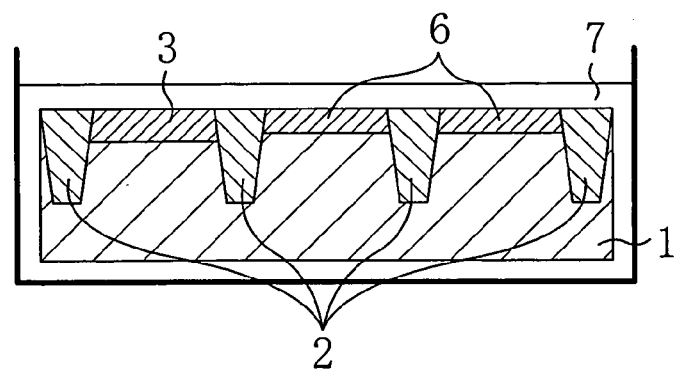

Next, as shown in FIG. 3C, after the photoresist 5 was removed using a 130° C. mixed solution of sulfuric acid and hydrogen peroxide solution, the semiconductor substrate 1 was immersed in 50% heated nitric acid 7 of a temperature of 80° C. for 60 minutes and then an $SiO_2$ film, i.e., a second gate oxide film (a second oxide film) 6 having a thickness of 2 nm, was formed in a region 4 of the substrate from which the first oxide film 3 had been removed.

Figure 3D:
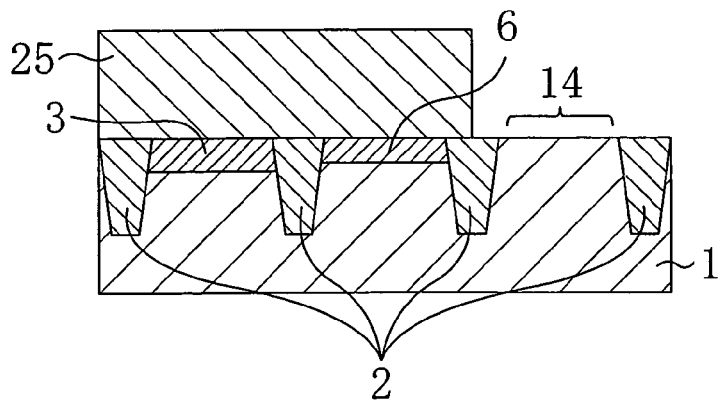

Thereafter, as shown in FIG. 3D, a photoresist 25 was formed as a mask over the regions in which a first gate insulating film 11 was to be formed and in which a second gate insulating film 12 was to be formed, and then etching using diluted hydrofluoric acid was performed to remove part of the second oxide film 6 located on the region in which a third gate insulating film 13 was to be formed.

Figure 4A:
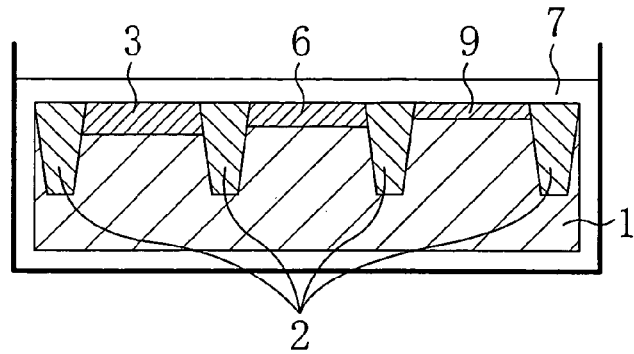
FIGS. 4A through 4C are cross-sectional views schematically illustrating the latter half of respective process steps according to the third example of the present invention.

Next, as shown in FIG. 4A, after the photoresist 25 was removed using a 130° C. mixed solution of sulfuric acid and hydrogen peroxide solution, the substrate was immersed in 50% heated nitric acid 7 of a temperature of 80° C. for 10 minutes and then an $SiO_2$ film, i.e., a third gate oxide film (a third oxide film) 9 having a thickness of 1.1 nm, was formed in a portion 14 of the substrate from which the second oxide film 6 had been removed. In this case, the average thicknesses of the first oxide film 3 and the second oxide film 6 were still 5.5 nm and 2 nm, respectively.

Each of the film thickness uniformities of the second oxide film 6 and the third oxide film 9 measured by ellipsometry was 0.01 nm (σ) in a 200 mm wafer surface.

In this process step, three different gate oxide films, i.e., the first oxide film 3 having a thickness of 5.5 nm, the second oxide film 6 having a thickness of 2 nm and the third oxide film 9 having a thickness of 1.1 nm were formed.

Figure 4B:
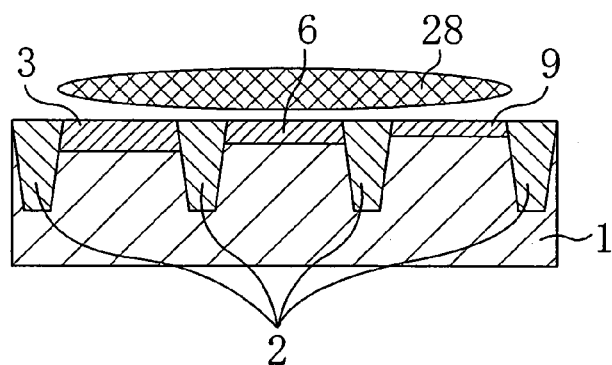

Subsequently, as shown in FIG. 4B, the substrate 1 in which the oxide films 3, 6 and 9 were formed was exposed for 10 seconds to a nitrogen plasma 28 of 1500 W and at a temperature of 400° C., i.e., a microwave excitation surface wave plasma. In this case, argon was used as an addition gas. The estimated electron energy then was about 1 eV and the ion density of the nitrogen plasma 28 was $7 \times 10^{10}$ $cm^{-3}$.

Subsequently, thermal treatment was performed for 20 seconds at a temperature of 1000° C. and in an oxygen atmosphere of 5 Torr.

Figure 4C:
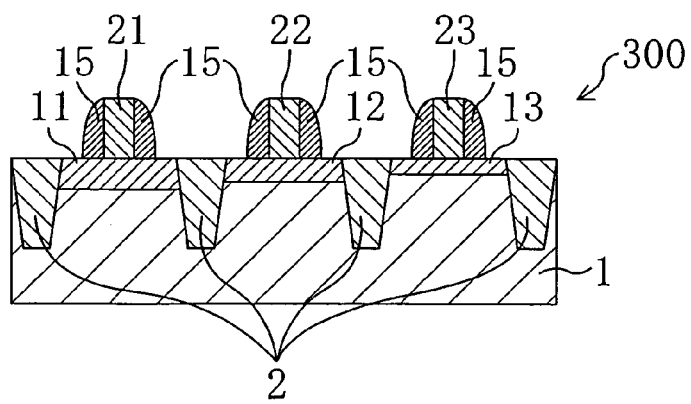

Next, as shown in FIG. 4C, a polycrystalline silicon film was deposited to a thickness of 150 nm at 620° C., an N-channel gate and a P-channel gate were doped with phosphorous and boron, respectively, and then patterning using a photolithography and dry-etching were performed in a known manner. Thus, gate electrodes 21, 22 and 23 were formed.

Thereafter, ions were implanted into an LDD region and, furthermore, low pressure CVD using TEOS (tetra ethyl ortho silicate) at a temperature of 650° C. and etch back were performed, thereby forming a sidewall 15. Then, arsenic ions and boron ions were implanted into the N-channel and the P-channel, respectively, thereby forming source/drain regions. Thereafter, regular process steps of forming an interlevel film and an interconnect were performed.

When the respective electrical thicknesses of the first, second and third gate insulating films 11, 12 and 13 formed in the above-described manner were measured by a high-frequency CV measurement (a capacitance-voltage measurement), the electrical thickness of the first gate insulating film 11 was 5.7 nm, the electrical thickness of the second gate insulating film 12 was 1.9 nm and the electrical thickness of the third gate insulating film 13 was a 1.0 nm. The physical thicknesses of the first gate insulating film 11, the second gate insulating film 12 and the third gate insulating film 13 were 5.5 nm, 2.0 nm and 1.1 nm, respectively. Note that when a high-frequency CV measurement was conducted for a silicon dioxide film having a physical thickness of 2.0 nm, the electrical thickness thereof was 2.2 nm. The electrical thickness of a silicon dioxide film having a physical thickness of 1.1 nm was 1.3 nm.

Figure 5C:
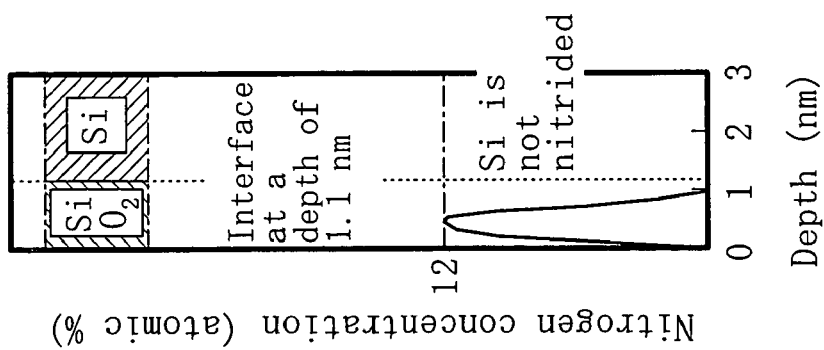
FIGS. 5A through 5C are graphs showing distribution of nitrogen concentration in the film thickness direction for gate insulating films formed in the third example.
Figure 5B:
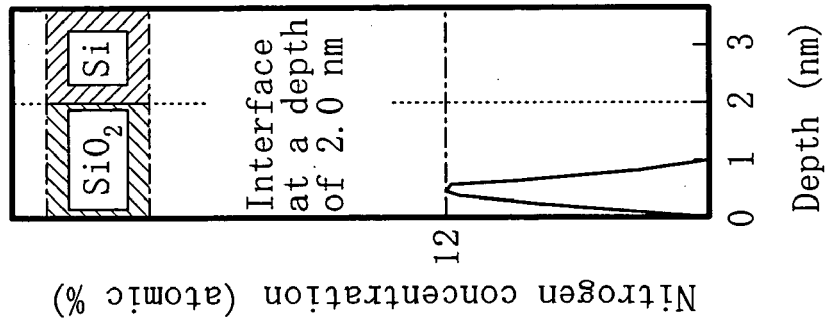
Figure 5A:
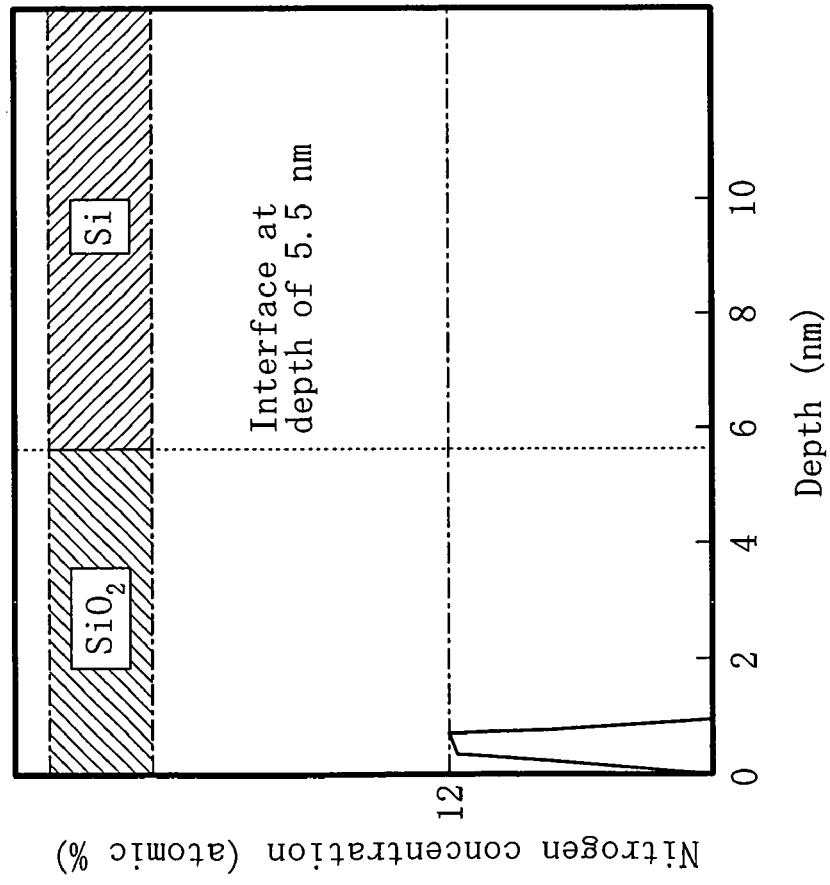

FIG. 5 shows SIMS distribution of nitrogen concentration in the film thickness direction for the three different gate insulating films 11, 12 and 13 of the semiconductor device of the present invention. In the SIMS distribution of each of the gate insulating films 11, 12 and 13, a peak position of the nitrogen concentration was located at a distance of about 0.5 nm from the surface of a film (the interface with a gate electrode) as in the first example, and the peak concentration was 12 atomic %. The three different gate insulating films had about the same nitrogen concentration profile. For the third gate insulating film 13 having the smallest thickness, i.e., a thickness of 1.1 nm, the nitrogen concentration at the interface between the gate insulating film 13 and the semiconductor substrate 1 was 1 atomic % or less. Also, almost no nitriding in the substrate 1 was observed. From the results described above, for the electrical thickness measured by a high-frequency CV measurement, a very small value, i.e., 1.0 nm was obtained. As for a leakage current in the third gate insulating film 13, a reduction by two orders in magnitude (about 1/100), compared to a thermal oxide film having the same physical thickness as that of the third gate insulating film 13 was observed. Therefore, it has been confirmed that base oxide film formation and subsequent nitriding using a high density nitrogen plasma having a low energy were very effective in reduction for a leakage current in a very thin gate insulating film and reduction in an electrical thickness.

Next, the leakage current will be described.

Figure 6:
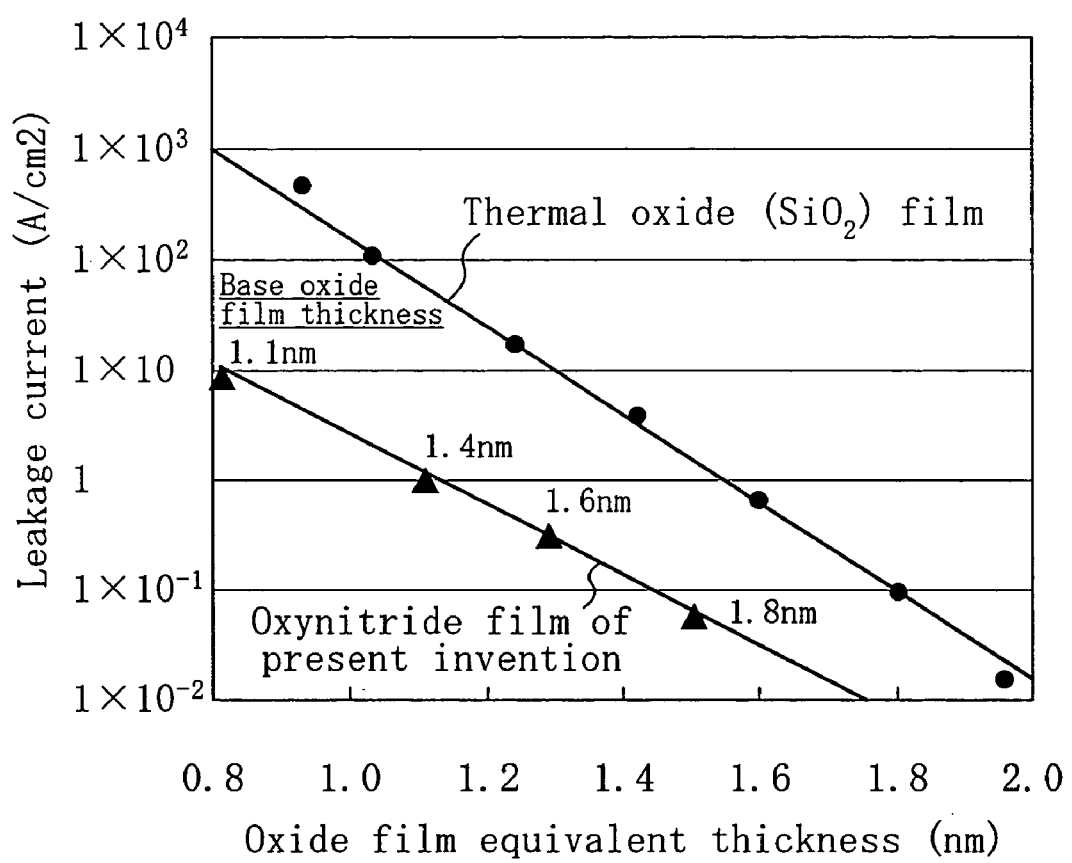
FIG. 6 is a graph showing the relationship between oxide film equivalent thickness and leakage current.

FIG. 6 is a graph of leakage currents in a silicon oxide film formed by thermal oxidation and an oxynitride film (gate insulating film) formed in a method according to the present invention and having a thickness of 0.8–1.8 nm in terms of oxide film equivalent thickness when driving voltage is 2V. The oxide film equivalent thickness of a film is indicated by a physical thickness of a silicon dioxide film having the same electrical thickness as that of the film.

In general, reduction in the thickness of a gate oxide film causes increase in a leakage current flowing in the gate oxide film. Although the conduction mechanism of a silicon dioxide film normally is due to a Fowler-Nordheim tunnel current, in a region of a film having a thickness of 3.5 nm or less, a direct tunnel current is dominant. Accordingly, as the thickness of the film is reduced by 0.2 nm, a leakage current is increased by one order in magnitude. Therefore, in a film having a thickness of 2.6 nm or less, a gate leakage current flowing in a gate insulating film among leakage currents in a transistor can not be disregarded. In a known gate insulating film, reduction in such a leakage current is one of big challenges. However, it has been confirmed that a leakage current in an oxynitride film formed according to the present invention is smaller by about 1.5–2 orders in magnitude than that in a silicon oxide film formed by thermal oxidation. Within a range shown in FIG. 6, a leakage current in the oxynitride film of the present invention is about $1/20$–$1/100$ of a leakage current in a thermal oxide film having the same physical thickness as that of the oxynitride film. This shows excellent film quality of a chemical oxide film formed using heated nitric acid and effectiveness of oxynitride film formation by exposure to a nitrogen plasma having a low energy.

Fourth Example

A fourth example of the present invention will be described with reference to FIG. 7.

Figure 7:
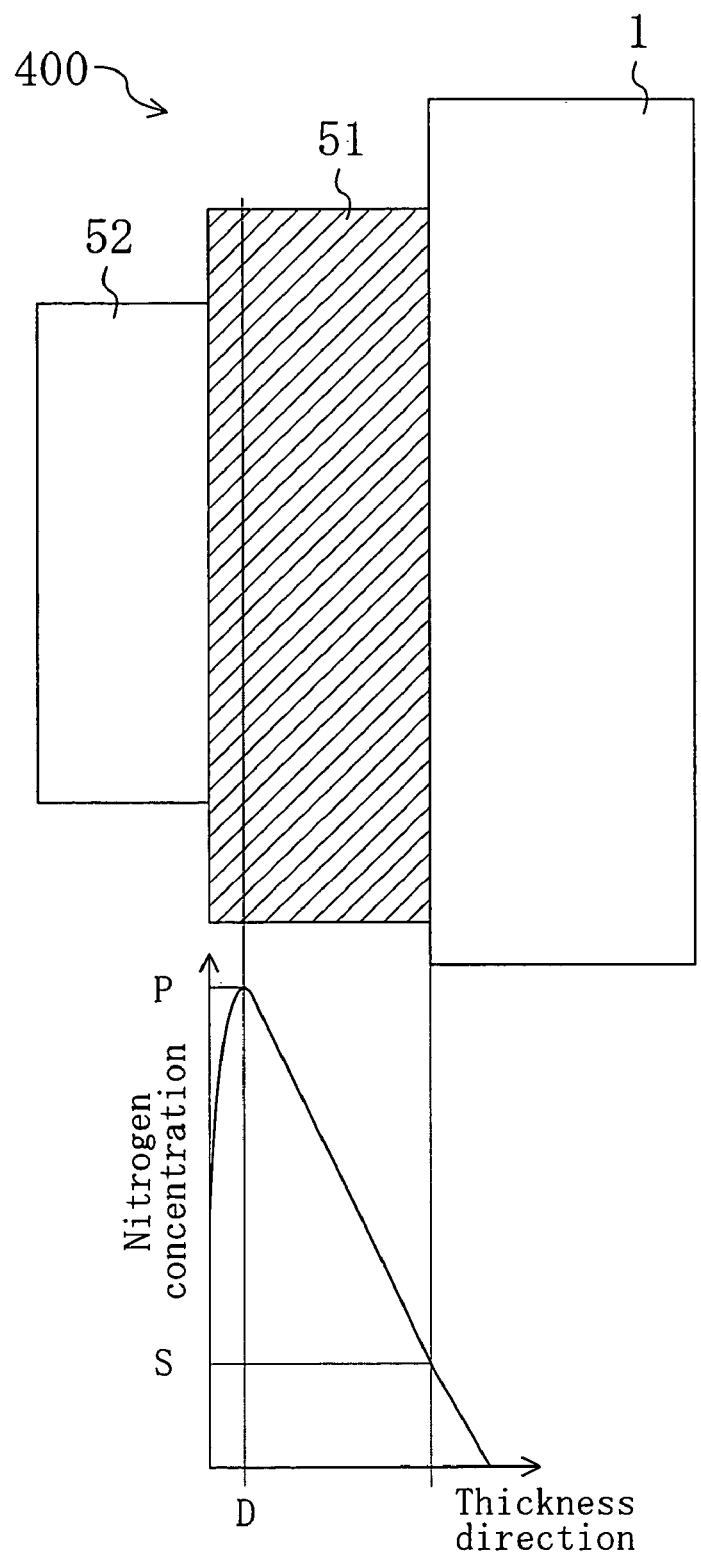
FIG. 7 is a cross-sectional view illustrating a fourth example of the present invention.

FIG. 7 illustrates a schematic view of a semiconductor device 400 having a MIS structure as an exemplary field effect transistor or capacitor having a metal-insulating film-semiconductor structure. In FIG. 7, source and drain, an LDD, a well, an isolation and the like which were actually provided in the semiconductor device and do not directly relate to the present invention are omitted. On a semiconductor substrate 1 made of silicon, provided was an oxide film formed by immersing the substrate in 50% heated nitric acid of a temperature of 80° C. and having a thickness of 1.5 nm. The oxide film was exposed to a nitrogen plasma generated from a mixture of nitrogen gas and helium gas by an inductively coupled plasma and having an ion density of $2\times10^{10}$ cm$^{-3}$, thereby introducing nitrogen atoms into the oxide film. Thus, the oxide film was made into a gate insulating film 51. At this time, an adjustment was made so that a peak of nitrogen D is located at a distance of 0.5 nm from a surface of the gate insulating film 51. The nitrogen concentration at the peak P was 16 atomic %. Moreover, the nitrogen concentration at the interface S between the gate insulating film 51 and the semiconductor substrate 1 was 0.9 atomic %.

Thereafter, as a gate electrode 52, a polycrystalline silicon film doped with boron as an impurity was deposited.

Thus, for the nitrogen concentration profile in the gate insulating film 51, a part of the gate insulating film 51 located closer to the electrode is made to have a high concentration and the nitrogen concentration at the interface S between the silicon substrate 1 and the gate insulating film 51 is made to be about 1 atomic %, so that diffusion of boron in the polycrystalline silicon film, i.e., the electrode 52 can be suppressed by nitrogen contained in the part of the gate insulating film 51 at a high concentration. Accordingly, boron is diffused in the gate insulating film 51 and then in silicon of the substrate 1 directly under the gate insulating film 51, thereby preventing reduction in mobility and change in a threshold voltage. Moreover, due to nitrogen contained in the part of the gate insulating film 51 at a high concentration, the gate insulating film 51 exhibits a higher dielectric constant than the dielectric constant unique to a silicon dioxide film, i.e., 3.9. As a result, with an equivalent physical thickness to that of a silicon dioxide film, a higher static capacitance can be obtained. In other words, a smaller electrical thickness than that of a silicon dioxide film can be obtained, thus improving the driving ability of a transistor.

Moreover, when high concentration nitrogen exists at the interface between the gate insulating film 51 and the silicon substrate 1, change in the mobility and threshold voltage of the transistor are caused due to diffusion of an impurity, the generation of an interface level, the generation of fixed charge resulting from the existence of high concentration nitrogen. However, when the nitrogen concentration at the interface is about 1 atomic %, as in this sample, deterioration of interface properties caused by dangling or broken bonds due to a disturbance of binding at the interface can be suppressed. This is because nitrogen exists at the interface at an amount enough to terminate a binding end of a dangling or broken bond. If an excessive amount of nitrogen exists, not only a binding end of a dangling or broken bond is terminated but also a normal binding is replaced with nitrogen, thus resulting in adverse side effects. Moreover, due to nitrogen contained in the gate insulating film at a high concentration, a leakage current is also reduced. Accordingly, with the gate insulating film of this example, a low leakage current and a high dielectric constant which can not be obtained in a known silicon dioxide film can be obtained. Therefore, the performance of the transistor can be far improved.

As has been described, an oxide film is formed using heated nitric acid serving as an oxidizer and then the oxide film is exposed to a plasma having an electron energy of 5 eV and containing nitrogen, so that a gate insulating film, i.e., an oxynitride film is formed. Using the gate insulating film, a semiconductor device is formed. Therefore, for the gate insulating film of the semiconductor device, uniformity of a film thickness can be achieved and the same thickness can be obtained as excellent reproducibility. Also, at the same time, the gate insulating film has an excellent film quality and a small electrical thickness, so that a leakage current can be reduced.

What is claimed is:

1. A method for fabricating a semiconductor device, comprising the steps of:
    forming an oxide film having a thickness of not more than 3 nm, using a solution including an oxidizer, on a surface of a silicon layer provided at least in part of a semiconductor substrate; and
    making the oxide film into an oxynitride film by exposing the oxide film to a plasma having an electron energy of 5 eV or less and containing nitrogen.

wherein the step of exposing the oxide film to a plasma containing nitrogen is performed just after the step of forming the oxide film using the solution including the oxidizer.

2. The method for fabricating a semiconductor device of claim 1, further comprising, before the step of forming an oxide film, the step of forming an isolation region using STI process.

3. The method for fabricating a semiconductor device of claim 1, wherein the ion density of the plasma is not less than $5 \times 10^9$ cm$^{-3}$ and not more than $1 \times 10^{12}$ cm$^{-3}$.

4. The method for fabricating a semiconductor device of claim 1, wherein the temperature of the plasma is not less than 0° C. and not more than 500° C.

5. The method for fabricating a semiconductor device of claim 1, wherein the plasma is selected one from the group consisting of an inductively coupled plasma, a magnetron plasma, a helicon wave plasma and a surface wave plasma.

6. The method for fabricating a semiconductor device of claim 1, wherein the oxidizer is nitric acid.

7. The method for fabricating a semiconductor device of claim 1, further comprising, after the step of making the oxide film into an oxynitride film, the step of performing thermal treatment to the semiconductor substrate in an atmosphere containing oxygen.

8. The method for fabricating a semiconductor device of claim 7, wherein in the step of performing thermal treatment, thermal treatment is performed at a process temperature of not less than 800° C. and not more than 1100° C. for a process time of not less than 10 seconds and not more than 120 seconds.

9. A method for fabricating a semiconductor device, comprising the steps of:
   removing part of a first oxide film formed on a surface of a semiconductor substrate;
   forming a second oxide film having a thickness of not more than 3 nm, using a solution including an oxidizer, in part of the semiconductor substrate from which the first oxide film has been removed; and
   making each of the first and second oxide films into an oxynitride film by exposing the first and second oxide films to a plasma having an electron energy of 5 eV and containing nitrogen,
   wherein the step of exposing the oxide film to a plasma containing nitrogen is peformed just after the step of forming the oxide film using the solution including the oxidizer.

10. The method for fabricating a semiconductor device of claim 9, further comprising: after the step of forming a second oxide film,
   the step of removing part of the second or first oxide film; and
   the step of forming a third oxide film, using a solution including an oxidizer, in part of the semiconductor substrate from which the first or second oxide film has been removed,
   wherein in the step of making each of the first and second oxide films into an oxynitride film, the third oxide film is also made into an oxynitride film.

11. The method for fabricating a semiconductor device of claim 9, wherein the thickness of the second oxide film is smaller than that of the first oxide film.

12. The method for fabricating a semiconductor device of claim 9, wherein the first oxide film is formed by thermal oxidation or plasma oxidation.

13. The method for fabricating a semiconductor device of claim 9, wherein the first oxide film is formed using a perchloric acid solution.

14. The method for fabricating a semiconductor device of claim 9, wherein the ion density of the plasma is not less than $5 \times 10^9$ cm$^{-3}$ and not more than $1 \times 10^{12}$ cm$^{-3}$.

15. The method for fabricating a semiconductor device of claim 9, wherein the temperature of the plasma is not less than 0° C. and not more than 500° C.

16. The method for fabricating a semiconductor device of claim 9, wherein the plasma is selected one from the group consisting of an inductively coupled plasma, a magnetron plasma, a helicon wave plasma and a surface wave plasma.

17. The method for fabricating a semiconductor device of claim 9, wherein the oxidizer is nitric acid.

18. The method for fabricating a semiconductor device of claim 9, further comprising, after the step of making each of the first and second oxide films into an oxynitride film, the step of performing thermal treatment to the semiconductor substrate in an atmosphere containing oxygen.

19. The method for fabricating a semiconductor device of claim 18, wherein in the step of performing thermal treatment, a process temperature is not less than 800° C. and not more than 1100° C. and a process time is not less than 10 seconds and not more than 120 seconds.

* * * * *